Figure 1:
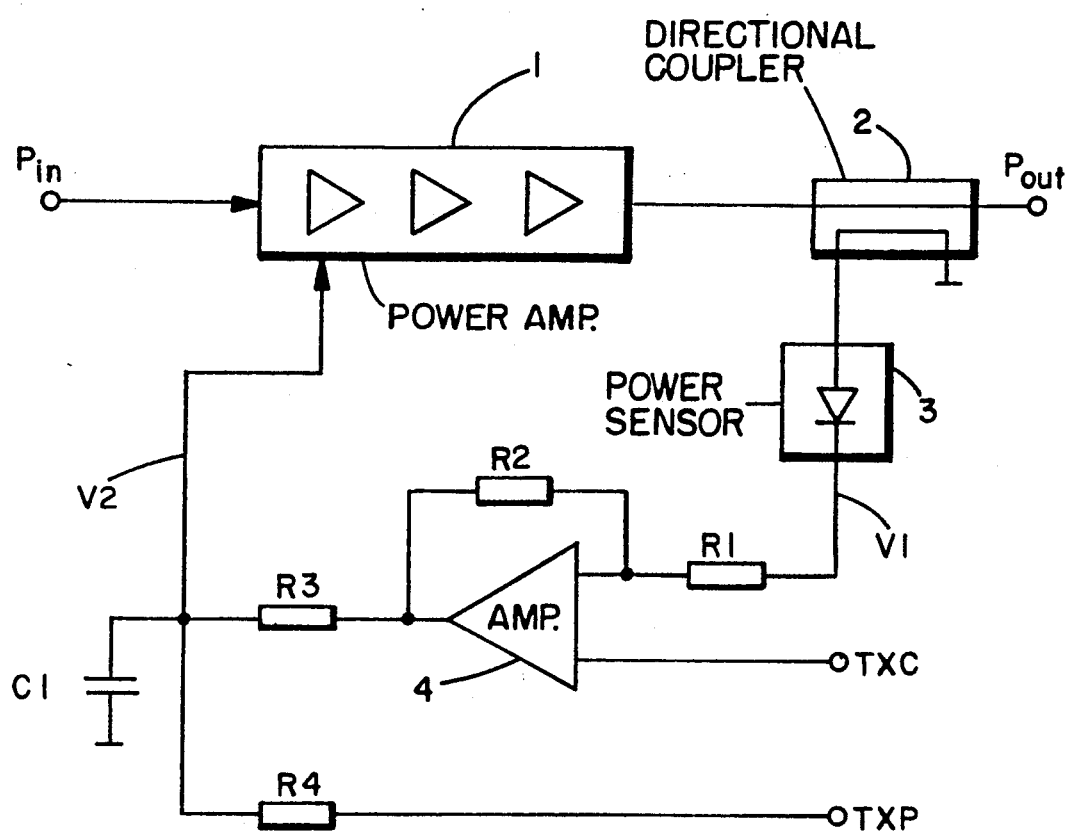

United States Patent [19]
Vaisanen et al.

[11] Patent Number: 5,311,179
[45] Date of Patent: May 10, 1994

[54] METHOD FOR AMENDING THE EFFECT OF OFFSET VOLTAGE VARIATIONS FROM THE OUTPUT VOLTAGE IN A D/A CONVERTER

[75] Inventors: Risto Vaisanen; Jukka Sarasmo, both of Salo, Finland

[73] Assignee: Nokia Mobile Phones Ltd., Salo, Finland

[21] Appl. No.: 970,281

[22] Filed: Oct. 30, 1992

[30] Foreign Application Priority Data

Nov. 8, 1991 [FI] Finland ................................. 915288

[51] Int. Cl.[5] .............................................. H03M 1/06
[52] U.S. Cl. ..................................... 341/118; 341/144
[58] Field of Search ............... 341/118, 119, 120, 121, 341/144, 152, 153; 370/110.1, 58.1, 58.2, 58.3, 97, 95.3

[56] References Cited

U.S. PATENT DOCUMENTS 5,027,352  6/1991  Goode ............................... 370/110.1
5,101,175  3/1992  Vaisanen ............................. 330/279

Primary Examiner—Brian K. Young
Attorney, Agent, or Firm—Perman & Green

[57] ABSTRACT

The present invention relates to an offset voltage zeroing method of a D/A converter, with the aid of which oscillations of the output voltage of said D/A converter can be radically reduced. An output signal of the converter is carried to a first terminal of a capacitor (5). A second terminal of the capacitor is coupled to a reference voltage ($V_{ref}$) with a controllable switch (6) as long as there are no pulses in the output of the converter. As a result, an amended output signal is obtained from the second terminal.

6 Claims, 2 Drawing Sheets

METHOD FOR AMENDING THE EFFECT OF OFFSET VOLTAGE VARIATIONS FROM THE OUTPUT VOLTAGE IN A D/A CONVERTER

The present invention relates to an offset voltage zeroing method with which the output voltage variations of a D/A converter can be essentially reduced, said variations being caused by changes according to the temperature in offset voltages of the converter. The invention also relates to a circuit for implementing the procedure.

Especially in D/A converters using the CMOS technology, the problems are related to variations of the output voltage at different temperatures, these being on one hand dependent on variations in the reference voltage and on the other, on the drifting of the offset voltage of the operational amplifiers used in the implementation of converters. The reference voltage could, in principle, be formed using circuits external to the converter, but that would lead to an increase in the number of components and in additional costs. In addition, changes in the offset voltage would still cause problems.

In digital radio telephones, a transmission is carried out in the form of bursts so that a signal to be transmitted consists of subsequent pulses. A rise and decay of a transmission pulse should not be stepwise but the rise and decay are expected to be controllable so that the transmission spectrum would not spread to be too wide; nevertheless, the rise and decay times should be as short as possible. The $\cos^2$ waveform has often been considered to be an appropriate rising and decaying pulse shape. The timing of a transmission pulse should also be independent of the power level of the transmitter.

In the Patent Application No. FI-896266 "(A power control method for a voltage controlled power amplifier and circuitry used in the same") a power control method of a transmitter based on the use of two control signals TXC and TXP is disclosed. The block diagram of the transmitter of a digital radio telephone according to said method is presented in FIG. 1. In the circuit the input square wave pulses $P_{in}$ are amplified as desired and $\cos^2$-transformed, as to the rise and decay, into output powered pulses $P_{out}$ in a multistage power amplifier 1. The output power is measured with the aid of a direction coupler 2 and a power sensor 3 from which a voltage V1 comparable to the power is obtained. Said voltage is carried to a control amplifier 4 being e.g. an operational amplifier, and a control pulse TXC enters a second input of the control amplifier 4 from the D/A converter. The control loop includes resistors R1, R2 and R3. With the output voltage of the control amplifier 4 a square wave pulse TXP is summed after the resistor R3, the height of said pulse being about as great as the voltage after which there is power at the output of the power amplifier 1. The square wave pulse starts substantially at the same moment as the control pulse TXC starts to rise. Now the capacitor C1 is charged through the resistor R4 to approach rapidly the threshold level, and the control loop of the power amplifier 1 is operative as soon as there is power at the output of the power amplifier 1.

If the actual control signal TXC affecting the output power has been produced e.g. with an ordinary inexpensive CMOS-D/A converter, the output power changes together with the changing temperature. This is due to changes of the reference voltage and offset voltage in the D/A converter described above.

Very few means for eliminating said problem are available in the art. An individual temperature compensation can be carried out in every radio telephone, which causes extra work. Alternatively, high-standard and more expensive D/A converters may also be used.

The object of the present invention is to provide an offset voltage zeroing procedure of a D/A-converter with which the above described problems can be solved. For achieving said aim, the present invention is characterized in that the variations of the offset voltage are eliminated from a TXC-D/A signal by adding a serial capacitor and by keeping the end of the capacitor facing the TXC circuit with the aid of a switch at a reference voltage $V_{ref}$ as long as there is no pulse in the TXC-D/A signal.

Figure 2:
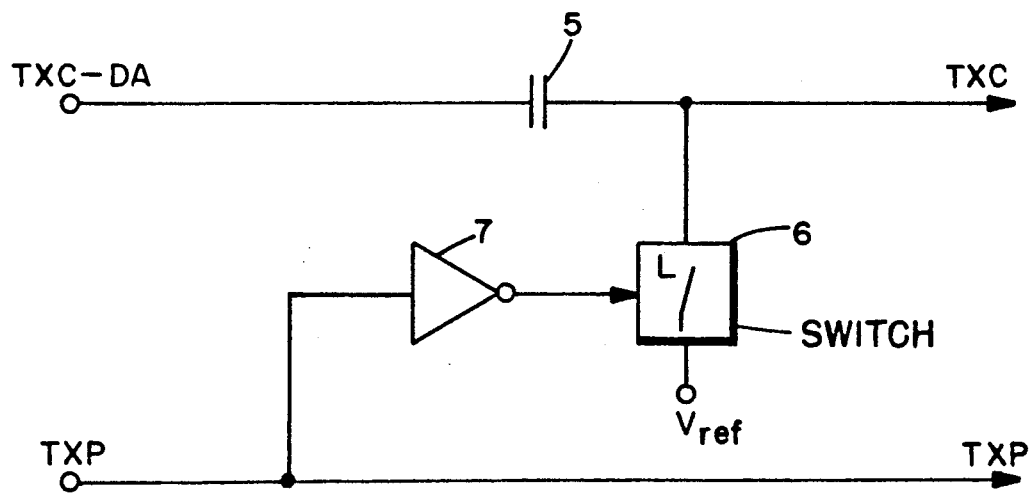
Figure 3:
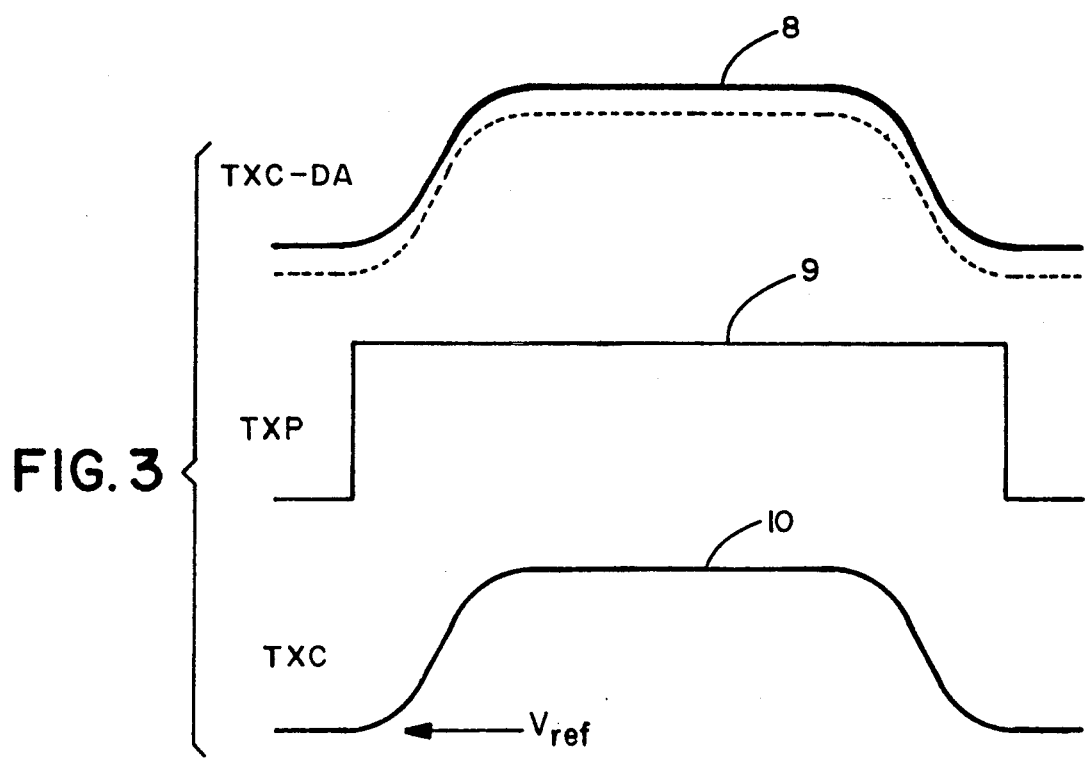
Figure 4:
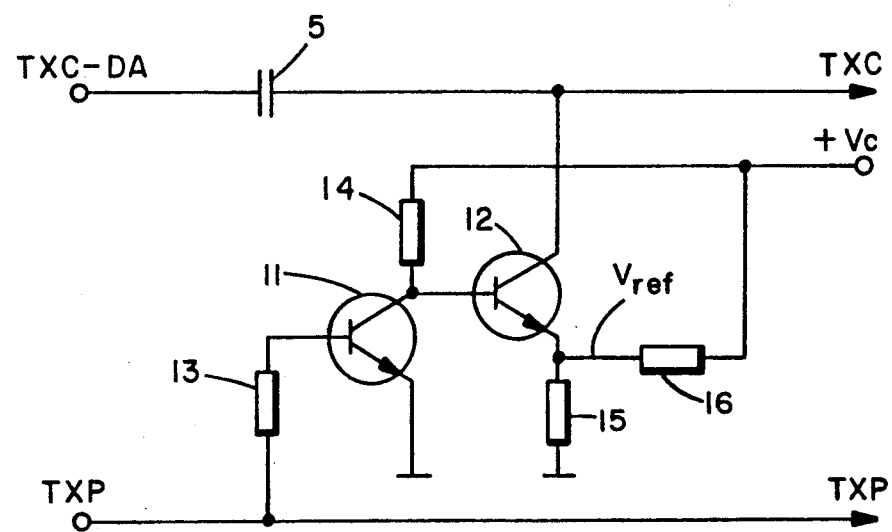

The invention is described below in detail referring to the accompanying figures, in which:

FIG. 1 presents schematically a power control method of a transmitter based on the use of two control signals TXC and TXP, FIG. 2 presents the operation principle of the offset voltage zeroing method of a D/A converter according to the invention, FIG. 3 presents curve shapes of the signals used in the method according to the invention, and FIG. 4 presents the circuitry diagram of the method according to the invention.

FIG. 1 is described above. The design of the invention is described below referring to FIGS. 2 to 4 which show an embodiment of the design according to the invention.

FIG. 2 shows the operation principle of an offset voltage zeroing system of a D/A converter according to the invention. A TXC-D/A signal is a pulse derived from a D/A converter, being in shape $\cos^2$ as regards its rise and decay, intended for controlling the transmitter 1 shown in FIG. 1, and the TXC signal refers to a pulse obtained from a TXC-D/A signal to be carried to the power control loop of a transmitter, and being $\cos^2$-shaped regarding the rise and decay, wherefrom the variations of the offset voltage have been removed. The TXP signal is a square wave pulse used in accelerating the power control circuit in the manner described in the Finnish Patent application FI-896266. The changes in the output voltage TXC-D/A of a D/A converter, caused by variations in the offset voltage, can be removed from the TXC-D/A signal by adding a serial capacitor 5 and by maintaining the end of the capacitor 5 facing the TXC terminal with the aid of a switch 6 at the reference voltage $V_{ref}$ as long as there are no pulses in the TXC-D/A signal. As soon as a pulse TXC-DA enters, the switch opens and $V_{ref}$ is switched off from the TXC terminal of the capacitor 5. The pulse may now travel unchanged through the capacitor 5, and after the pulse ends, the voltage of the TXC terminal is switched back to the level of the reference voltage. The switch 6 is controlled via an inverter 7 with a TXP pulse.

FIGS. 2–4 are related to an embodiment of the invention in controlling the transmitter of a radio telephone, but the invention may also be employed otherwise in stabilizing the output voltage of a D/A converter.

If the switch 6 were not at all used, the voltage level would glide after the capacitor 5 up and down, being dependent, as regards the rise and decay, on the level of the $\cos^2$ shaped pulse. If the switch 6 is zeroactive in operation, no inverter 7 is needed. No inverter 7 is needed, either, if an inverted TXP pulse is used in the power control loop.

The same offset voltage zeroing principle may also be used in applications using the time-sharing principle, since the offset voltage can be zeroed without being included in the actual operational cycle.

FIG. 3 shows the curve shapes of the signals employed in the procedure of the invention. The dashed line presents the variation of the TXC-D/A output voltage 8 of a D/A converter caused by the offset voltage. The TXP voltage is indicated by numeral 9 and the TXC voltage by numeral 10.

FIG. 4 shows the circuit diagram of the method according to the invention. For the inverter 7, a transistor 11 is used and for the switch 6, a transistor 12. The TXP square wave pulse has been carried to the base of the transistor 11 through a resistor 13. The base of the transistor 12 has been coupled to the positive operating voltage through a resistor 14. The reference voltage has been produced from the operating voltage with the aid of voltage divider resistors 15 and 16. The reference voltage may also be zero, resulting in omission of the resistors 15 and 16, and in grounding the emitter of the transistor 12.

With the aid of the invention, D/A converters of prior art technology can be used. Only a few additional components are needed in the design, and it removes the need of tuning the stages controlled with a D/A converter.

No individual temperature compensations of radio telephones are needed and also advantages related to production are achieved, such as improvement in the gain. Most part of the offset voltage zeroing coupling can be integrated within a D/A converter circuit.

Compensation of the offset voltage of a D/A converter is described above with an example concerning the control pulse of a radio phone transmitter implemented by means of the digital time sharing principle. It is obvious that this principle can be used in any embodiment in which one wishes to eliminate the effect of the offset voltage from the out put voltage of a D/A converter. The only prerequisite for said application is to find out when a pulse from the converter starts and ends and that this information can be used for controlling the switch. Said information can be obtained from another pulse which preferably starts just a bit before the start of a pulse from the converter and ends simultaneously therewith. The invention is particularly appropriate for use in a radio telephone operating on the time division principle.

We claim:

1. A circuit for eliminating effects of offset voltage variations in pulsatile outputs appearing at an output of a digital to analogue (D/A) converter means, said circuit comprising:
   an input terminal and an output terminal, said input terminal coupled to said output of said D/A converter means;
   a capacitor connected in series between said input terminal and said output terminal;
   a reference potential source;
   switch means connected between said reference potential source and said output terminal; and
   control means connected to said switch means for causing said switch means to connect said reference potential source to said output terminal when no pulsatile output is present at said input terminal.

2. The circuit as defined in claim 1, wherein said control means applies a pulsatile control voltage to said switch means, said pulsatile control voltage having a duration that starts and ends substantially simultaneously as a said pulsatile output from said D/A converter means, said pulsatile control voltage causing said switch means to disconnect said reference potential source from said output terminal for said duration.

3. The circuit as defined in claim 1, wherein said control means applies a pulsatile control voltage to said switch means, said pulsatile control voltage having a duration that starts just prior to and ends substantially simultaneously as a said pulsatile output from said D/A converter means, said pulsatile control voltage causing said switch means to disconnect said reference potential source from said output terminal for said duration.

4. The circuit as recited in claim 2 wherein said control means applies a positive voltage to said switch means to cause said switch means to connect said reference potential to said output terminal.

5. The circuit as recited in claim 2 wherein said pulsatile control voltage is of opposite sense to said pulsatile output from said D/A converter means.

6. The circuit as recited in claim 2 wherein said circuit is a portion of a radio telephone transmitter that outputs a time division multiplex signal, and wherein said pulsatile output from said D/A converter means is derived from a power amplifier in said transmitter and said pulsatile control voltage comprises a square wave pulse summed with said pulsatile output from D/A converter means.

* * * * *